(12) United States Patent
Cho et al.

(10) Patent No.: US 9,392,718 B2
(45) Date of Patent: Jul. 12, 2016

(54) ELECTRONIC DEVICE

(71) Applicant: Samsung Electronics Co., Ltd., Suwon-si, Gyeonggi-do (KR)

(72) Inventors: Chong-Kun Cho, Suwon-si (KR); Cheol-Hee Kim, Seoul (KR); Hun-Hong Kim, Incheon (KR); Hyun-Su Lim, Yongin-si (KR); Byoung-Uk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 103 days.

(21) Appl. No.: 14/098,910

(22) Filed: Dec. 6, 2013

(65) Prior Publication Data

US 2014/0168870 A1    Jun. 19, 2014

(30) Foreign Application Priority Data

Dec. 14, 2012  (KR) .................. 10-2012-0146595

(51) Int. Cl.
*G06F 1/16* (2006.01)
*H05K 7/12* (2006.01)
*H04M 1/02* (2006.01)
(Continued)

(52) U.S. Cl.
CPC ............... *H05K 7/12* (2013.01); *G06F 1/1637* (2013.01); *G06F 1/1658* (2013.01); *H01L 27/323* (2013.01); *H04M 1/0266* (2013.01); *H04M 1/185* (2013.01)

(58) Field of Classification Search
CPC ... H05K 9/0022; H05K 9/0084; H05K 1/181; H05K 1/0231; H05K 1/0271; H05K 1/189; H05K 2201/09036; H05K 2201/09063; H05K 2201/09072; H05K 2201/10083; H05K 2201/10636; H05K 2201/2045; H05K 7/20; H05K 7/20581; H05K 7/12; G06F 3/016; G06F 1/16; G06F 1/1616; G06F 1/162; G06F 1/1643; G06F 1/1656; G06F 1/166; G06F 1/1662; G06F 1/1679; G06F 1/1681; G06F 1/1683; G06F 1/183; G06F 3/0338; G06F 3/03547; G06F 3/041; G06F 1/1637; G06F 1/1658; G06F 1/187; H04M 1/0266; H04M 1/185; H01L 27/323
USPC ............ 361/679.01, 679.21, 679.26, 679.27, 361/679.31–679.39, 679.55–679.58, 361/679.31–679.39; 455/575.1–575.5
See application file for complete search history.

(56) References Cited

U.S. PATENT DOCUMENTS 6,151,207 A    11/2000  Kim
7,760,287 B2 *  7/2010  Oohira .............. G02F 1/133308
                                                349/150
(Continued)

FOREIGN PATENT DOCUMENTS

JP    2006-098799 A    4/2006
JP    2012-194972 A    10/2012
(Continued)

*Primary Examiner* — Anthony Haughton
*Assistant Examiner* — Ingrid Wright
(74) *Attorney, Agent, or Firm* — Jefferson IP Law, LLP

(57) ABSTRACT

An electronic device is provided. The electronic device includes a display module, a support plate on which the display module is disposed, and a plurality of openings which are disposed along an outer circumference of the support plate and which reduce vibration transmitted to the display module through the support plate, wherein the vibration is caused by a shock generated in an outer side of the electronic device.

25 Claims, 10 Drawing Sheets

(51) Int. Cl.
*H04M 1/18* (2006.01)
*H01L 27/32* (2006.01)

(56) References Cited

U.S. PATENT DOCUMENTS

| | | | | |
|---|---|---|---|---|
| 2007/0087793 | A1* | 4/2007 | Noma et al. | 455/575.3 |
| 2008/0002091 | A1 | 1/2008 | Son et al. | |
| 2008/0019084 | A1 | 1/2008 | Lee et al. | |
| 2010/0113108 | A1* | 5/2010 | Murata et al. | 455/575.1 |
| 2011/0187958 | A1 | 8/2011 | Ogatsu | |
| 2012/0044181 | A1* | 2/2012 | Kim et al. | 345/173 |
| 2013/0050228 | A1* | 2/2013 | Petersen et al. | 345/501 |

FOREIGN PATENT DOCUMENTS

| | | |
|---|---|---|
| KR | 20-0346257 Y1 | 3/2004 |
| KR | 20-0362335 Y1 | 9/2004 |
| KR | 10-2006-0102010 A | 9/2006 |
| KR | 10-2007-0013127 A | 1/2007 |
| KR | 10-2008-0077569 A | 8/2008 |

* cited by examiner

| #1 | 4TIMES |
|---|---|
| #2 | 4TIMES |
| #3 | 4TIMES |
| #4 | 6TIMES |
| #5 | 9TIMES |
| #6 | 1TIMES |
| #7 | 14TIMES |
| #8 | - |
| AVERAGE | 5.40TIMES |

ELECTRONIC DEVICE

CROSS-REFERENCE TO RELATED APPLICATION(S)

This application claims the benefit under 35 U.S.C. §119(a) of a Korean patent application filed on Dec. 14, 2012 in the Korean Intellectual Property Office and assigned Serial No. 10-2012-0146595, the entire disclosure of which is hereby incorporated by reference.

TECHNICAL FIELD

The present disclosure relates to an electronic device. More particularly, the present disclosure relates to an electronic device capable of preventing a display module from being damaged by a shock applied to the electronic device.

BACKGROUND

Recently, various electronic devices have been provided to users, and portable electronic devices that may be carried with the users to consume various contents, wherein the various electronic devices may include portable terminals, Motion Picture Experts Group (MPEG) Audio Layer 3 (MP3) players, Portable Multimedia Players (PMPs), electronic books, and so forth, have come into wide use. In particular, portable terminals, more specifically, portable terminals that may be referred to as smart phones have a variety of functions integrated therein. These electronic devices, or smart phones, are equipped with displays for allowing users to view various contents. A representative one of the displays is a Liquid Crystal Display (LCD), which is lightweight and has low power consumption. The LCD is a light-receiving device which displays an image by controlling the quantity of external light, such that a separate light source, that is, a backlight unit for irradiating light to an LCD panel, is used. Moreover, the LCD has technical limitations in terms of brightness, contrast ratio, a viewing angle, and an area and/or a screen size or panel size. Accordingly, a need for new displays capable of overcoming such technical limitations is increasing. As one of such new displays, an Organic Light Emitting Diode (OLED) has been developed and used as a display. The OLED is a self-light emitting device which uses a light-emitting film as a light-emitting layer without a need for a separate backlight unit, unlike the LCD, such that it may be lightweight and thin. The OLED is also favorable due to its high definition and low power consumption. Moreover, the OLED may be driven at a Direct Current (DC) low voltage and has quick response speed, high strength against a shock, and low manufacturing cost.

FIG. 1 is a diagram illustrating a portion of a side cross-section of a related art electronic device, and FIG. 2 is a diagram illustrating a support plate in which a display module is placed in FIG. 1 according to the related art.

Referring to FIGS. 1 and 2, the display module 12, which may also be referred to as an OLED 12, includes an upper plate 12a of a first electrode, a lower plate 12b of a second electrode, and a sealing member 13 which is provided between the upper plate 12a and the lower plate 12b to couple and seal the upper plate 12a and the lower plate 12b with each other. The OLED 12, structured as described above, is positioned on a front surface of an electronic device 10. If a shock is applied to a support plate 11, in particular, if a shock is applied to a front surface of the OLED 12, in a state where the OLED 12 is placed on the support plate 11, then the sealing member 13, which seals the upper plate 12a with the lower plate 12b, may be damaged due to vibration caused by the shock. The external shock applied to the electronic device 10 may generate vibration inside the electronic device 10, more specifically, the OLED 12, and the vibration inside the OLED 12, caused by the shock may cause damage to the sealing member 13 provided between the upper plate 12a and the lower plate 12b, thus damaging the entire OLED 12. Even if the strength of the electronic device 10, in which the OLED 12 is placed, is increased to prevent the above noted problems, the OLED 12 is exposed on the front surface of the electronic device 10, such that if a shock is applied toward the front surface of the OLED 12, the OLED 12 may be damaged due to damage of the sealing member 13. Additionally, FIG. 1 includes a cell sealing portion 14 that is formed by the sealing member 13.

FIG. 3 is a diagram showing the number of times a shock caused by dropping of the electronic device is applied to the electronic device when the display module is damaged according to the related art.

Referring to FIG. 3, when the number of times the shock is applied to the electronic devices 10 is 5.40, on the average, then the display module 12 mounted in the electronic device 10 is damaged. That is, as the shock, such as dropping of the electronic device 10, is applied 5.40 times to the electronic device 10, the display module 12 is damaged, and thus the electronic device 10 may not be available for use by the user.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device which is capable of preventing vibration, which is transmitted to the inside of the electronic device by a shock generated during the use of the electronic device, from being transmitted to a display and thus preventing the display from being damaged.

Another aspect of the present disclosure is to provide an electronic device which facilitates its carriage through reduction of a total weight of the electronic device.

In accordance with an aspect of the present disclosure, an electronic device is provided. The electronic device includes a display module, a support plate on which the display module is disposed, and a plurality of openings which are provided along an outer peripheral circumference of the support plate and which reduce vibration transmitted to the display module through the support plate, wherein the vibration is caused by a shock generated in an outer side of the electronic device.

In accordance with another aspect of the present disclosure, an electronic device is provided. The electronic device includes a main body, a display module which is disposed on a front surface of the main body and which includes an upper plate and a lower plate that is coupled to the upper plate in order to form a cell sealing portion with the upper plate, a support plate which is disposed in an inner side of the main body and in which the display module is disposed, and a plurality of openings which are provided along a peripheral circumference of the support plate and which reduces internal vibration of the display module, the internal vibration being caused by an external shock applied to the main body, and which reduces a weight of the support plate.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
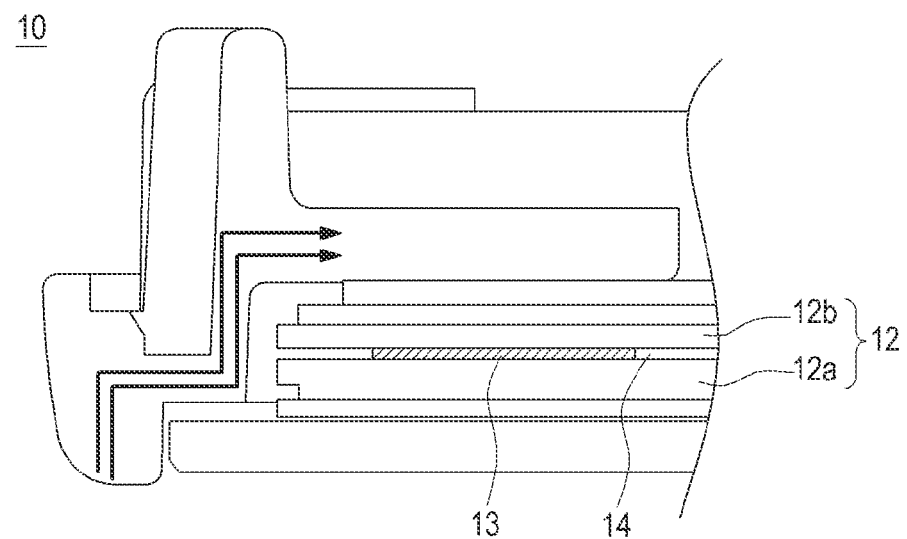
FIG. 1 is a diagram illustrating a portion of a side cross-section of an electronic device according to the related art.
Figure 2:
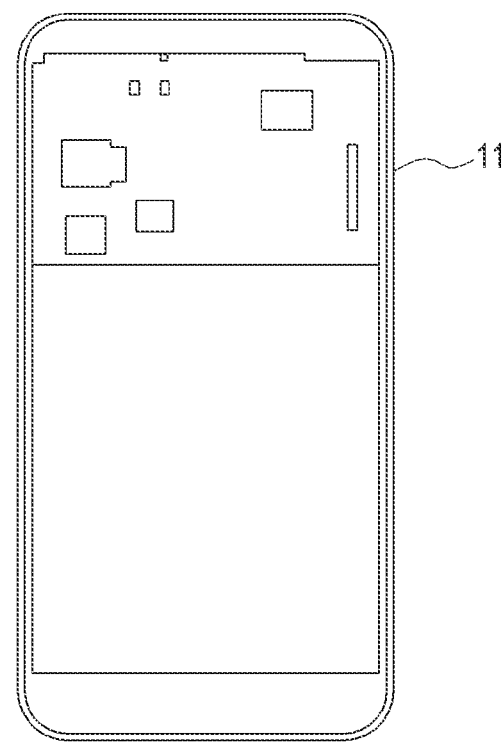
FIG. 2 is a diagram illustrating a support plate in which a display module is placed in FIG. 1 according to the related art.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, an electronic device according to the present disclosure, and more specifically, an electronic device capable of restricting vibration transmitted to a display device according to the present disclosure will be described with reference to the accompanying drawings. The thicknesses of lines or sizes of components illustrated in the drawings may be exaggerated for clarity and convenience of the description. Terms used herein are defined for functions in the present disclosure and may vary according to users, intentions of operators, or practice. Thus, the terms should be defined based on the entire contents of the present disclosure. Although ordinal numbers such as "first", "second", and so forth will be used in an embodiment described below, they are merely intended to distinguish objects having the same name, their order may be set arbitrarily, and the preceding description of an object may be applied to a next-order object.

The present disclosure relates to an electronic device, and more particularly, to an electronic device equipped with a display module having an at least one of an Organic Light Emitting Diode (OLED) and an Active Matrix OLED (AMOLED) of an on-cell touch type. When a shock is applied to the electronic device, the vibration caused by the shock is transmitted to an internal module. However, the present disclosure restricts transmission of vibration caused by the shock to the display module to prevent damage of the display module, and the present disclosure increases the strength of the display module to improve the reliability of the electronic device in terms of damage caused by dropping or a shock. Moreover, the present disclosure prevents vibration caused by an external shock, applied to the electronic device, from being transmitted to the display module and reduces a total load of the electronic device, thus improving portability. Hereinafter, with reference to the accompanying drawings, a detailed description will be made of an electronic device which restricts transmission of vibration generated therein by a shock to the display module.

Figure 4:
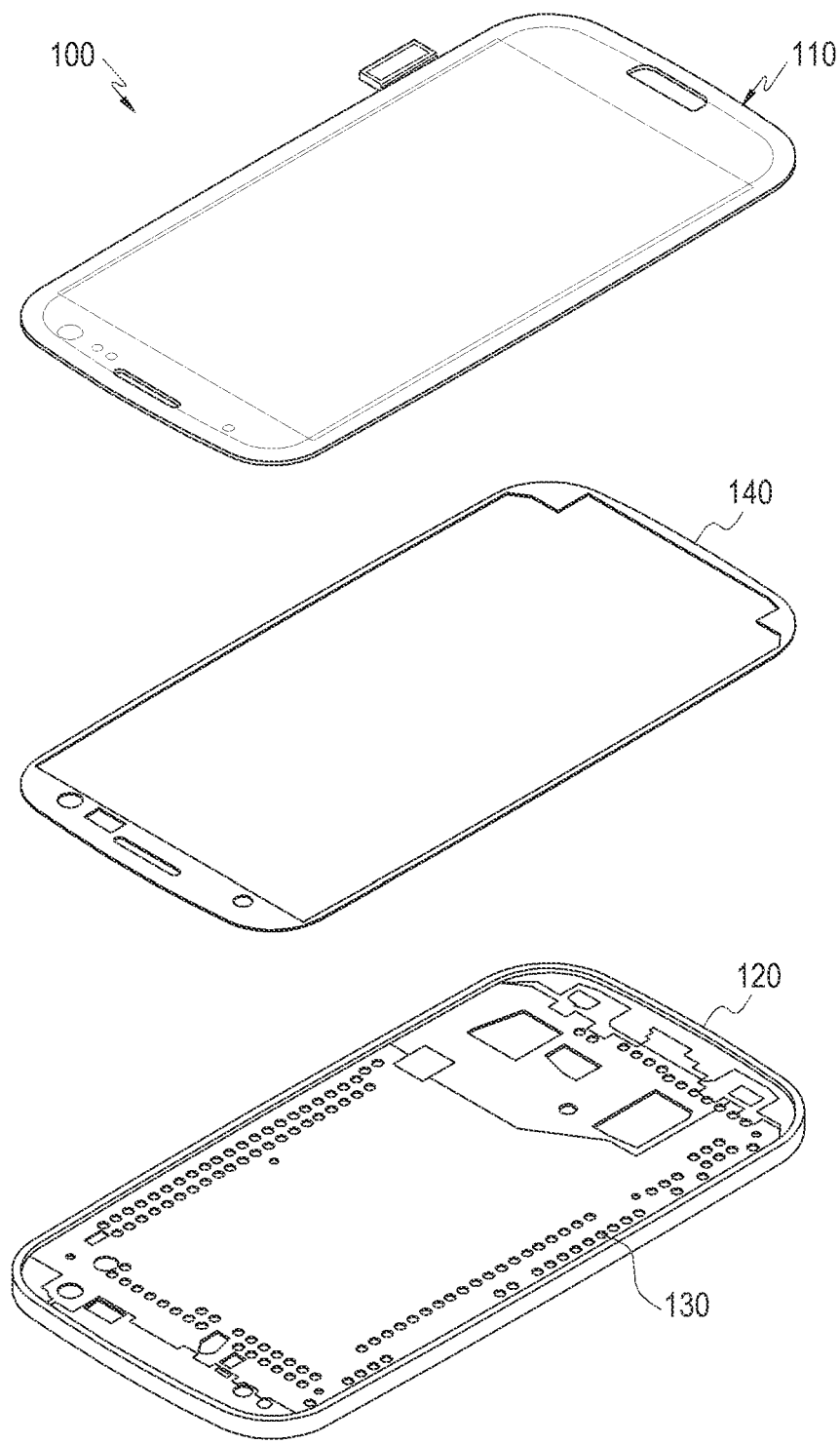
FIG. 4 is an exploded perspective view illustrating some components of an electronic device according to an embodiment of the present disclosure.
Figure 5:
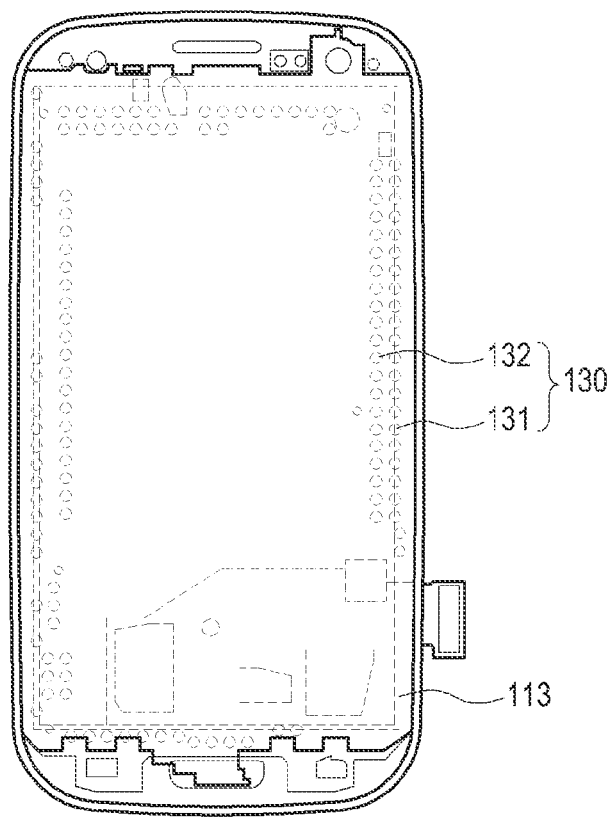
FIG. 5 is a front diagram illustrating an assembled state of the electronic device of FIG. 4 according to an embodiment of the present disclosure.

FIG. 4 is an exploded perspective view illustrating some components of an electronic device according to an embodiment of the present disclosure, and FIG. 5 is a diagram illustrating a state in which a display module is placed on a support plate in FIG. 4 according to an embodiment of the present disclosure.

Referring to FIGS. 4 and 5, an electronic device 100, according to the present disclosure, includes a display module 110, a support plate 120, and a coupling member 140. The support plate 120 includes a plurality of openings 130, which includes first openings 131 and second openings 132. The display module 110 is provided on a surface of the support plate 120, and includes an upper plate 111 (see FIG. 6), a lower plate 112 (see FIG. 6), and a sealing member 113 provided therebetween.

Figure 6:
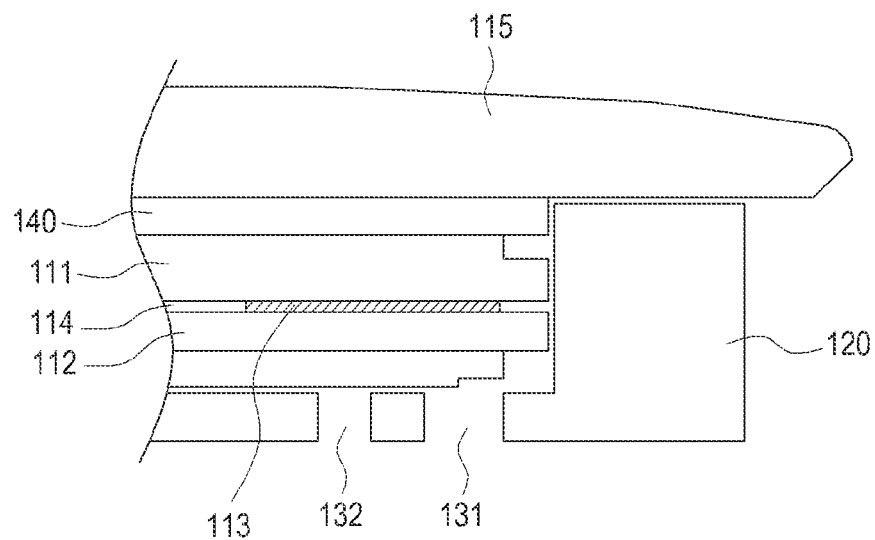
FIG. 6 is a partial cross-sectional diagram of FIG. 5 according to an embodiment of the present disclosure.
Figure 7:
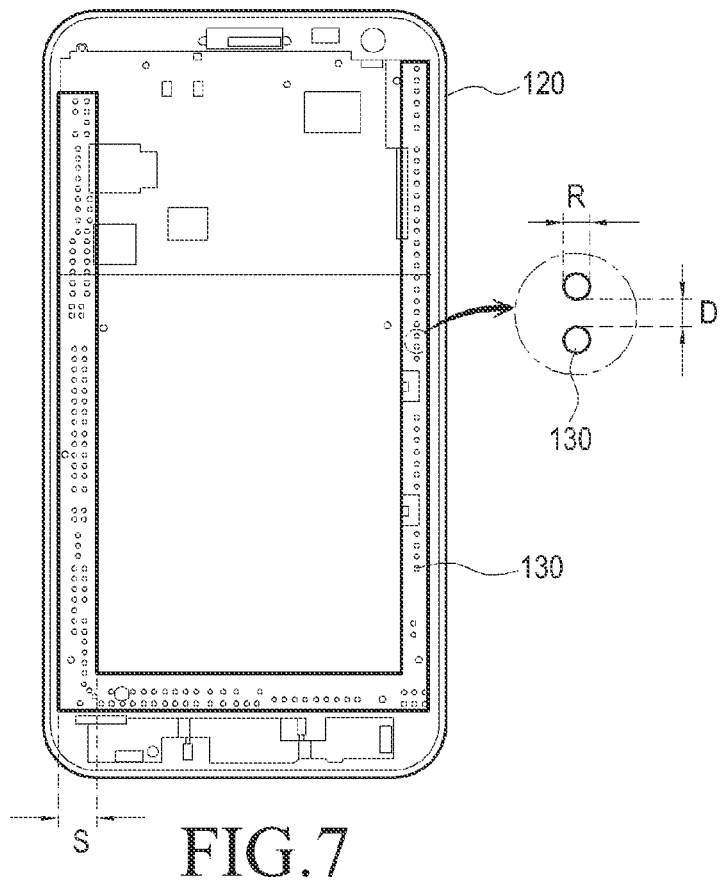
FIG. 7 is a diagram illustrating a support plate of FIG. 4 according to an embodiment of the present disclosure.

FIG. 6 is a partial cross-sectional diagram of FIG. 5, and FIG. 7 is a diagram illustrating the support plate of FIG. 4 according to an embodiment of the present disclosure.

Referring to FIGS. 6 and 7, the display module 110, according to the current embodiment, is of an On Cell Touch type AMOLED (OCTA) type, which may also be referred to as an OCTA display module 110, for example. In the embodiment of FIGS. 6 and 7, the OCTA display module 110 refers to an active organic field-effect light emitting diode. In the OCTA display module 110, the upper plate 111 includes ENCAPsulation (ENCAP) glass and the lower plate 112 includes Low Temperature Poly Silicon (LTPS) glass. The ENCAP glass is called a thin film encapsulating cover or sealing cover, and has a sealing function of preventing introduction of oxygen into a cell sealing portion 114. The LTPS glass includes fine interconnections capable of controlling an OLED.

The OCTA display module 110 has a main window 115 on its outermost side, in which the upper plate 111 of ENCAP glass and the lower plate 112 of LTPS glass are sequentially stacked under the main window 115. A coupling member 140 is provided between the main window 115 and the upper plate 111, which has visibility and shock resistance and couples the main window 115 with the upper plate 111. The coupling member 140 includes Super View Resin (SVR) to maintain visibility of the OCTA display module 110 and, at the same time, the coupling member 140 provides shock resistance. The sealing member 113 is provided between the upper plate 111 and the lower plate 112, such that the sealing member 113 forms the cell sealing portion 114 between the upper plate 111 and the lower plate 112 so as to couple the upper plate 111 with the lower plate 112 through sealing. More specifically, the sealing member 113 is formed between the upper plate 111 and the lower plate 112 along a peripheral circumference, such that the cell sealing portion 114 is formed in a space formed by the sealing member 113, a bottom surface of the upper plate 111, and a top surface of the lower plate 112. Thus, the cell sealing portion 114 is blocked from an external environment.

However, when the OCTA display module 110 is configured such that the main window 115 is located outermost and the upper plate 111, the sealing member 113, and the lower plate 112 are stacked in this recited order, then the sealing member 113 is most likely to be damaged by a shock applied to the OCTA display module 110 or by vibration caused by the shock. Moreover, the OCTA display module 110 reinforces the strength of the support plate 120, without being provided with a separate structure for supporting the display module 110 or reinforcing the strength of the display module 110, for example, a chassis, unlike in an LCD. As a result, vibration is generated in the support plate 120 due to a shock, such as dropping of the electronic device 100, and the vibration is transmitted to the OCTA display module 110, and more specifically, the vibration is transmitted to the upper plate 111 and the lower plate 112 coupled to the sealing member 113. However, due to a plurality of openings 130 formed in the support plate 120 in which the OCTA display module 110 is placed, the transmission of the vibration to the sealing member 113 is restricted. In the current embodiment, the upper plate 111 includes thin film ENCAP glass, and the lower plate 112 includes LTPS glass, for example.

The OCTA display module 110 is mounted on a top surface of the support plate 120 and a battery (not shown) or an internal module (not shown) is mounted on a rear surface of the support plate 120. In a peripheral circumference of the support plate 120, and more specifically, in a position of a circumferential portion of the support plate 120 facing a position of the sealing member 113 or a circumferential portion of the support plate 120 facing the sealing member 113, the plurality of openings 130 are formed. The openings 130 restrict transmission of vibration generated in the support plate 120, or generated in an internal module, due to a shock, generated in an outer side of the electronic device 100, to the OCTA display module 110, thus reducing the vibration. The openings 130 are formed in the sealing member 113, and more specifically, are formed between an inner side and an outer side of the sealing member 113. Thus, the openings 130 provided in the support plate 120 restrict transmission of vibration caused by a shock, generated in an outer side of the electronic device 100, to the OCTA display module 110, and more specifically, by a shock to the sealing member 113.

In this way, the OCTA display module 110 is supported and mounted by the support plate 120 and prevents the sealing member 113 from being damaged by vibration caused by a shock with the help of the openings 130. The openings 130 are preferably positioned to face the sealing member 113, but they may also be spaced apart from the inner side or outer side of the sealing member 113 by a predetermined interval, and thus the sealing member 113 and the openings 130 may be dislocated by a predetermined interval without facing each other. That is, the positions of the openings 130 may be changed variously as long as they restrict transmission of vibration generated in the support plate 120 and/or generated in the internal module due to a shock, generated in the outer side of the electronic device 100, to the OCTA display module 110, and especially, a shock to the sealing member 113. The following description will be made of various embodiments of the openings 130.

Referring to FIG. 7, the openings 130, according to an embodiment, are provided so as to face the sealing member 113 along the peripheral circumference of the support plate 120. The openings 130 are provided in a predetermined space S along the peripheral circumference of the support plate 120 in a specified and/or unspecified way. In FIG. 7, the openings 130, according to the embodiment illustrated in FIG. 7, are illustrated as being provided on three sides along the peripheral circumference of the support plate 120 due to separate holes and/or shapes provided in the support plate 120. That is, along the peripheral circumference, the openings 130 which are in a side of the support plate 120 are formed in two lines, the openings 130 which are in the other side of the support plate 120 are formed in one line, and the openings 130 which are in the lower side of the support plate 120 are formed by a combination of the openings 130 of the one line and the two lines.

An interval D between the openings 130 is preferably less than a size R of the opening 130, but the interval D between the openings 130 and the size R of the opening 130 may also be determined considering the shape of the support plate 120. Although the openings 130 have circular hole shapes in the embodiment of the present disclosure, the openings 130 are not limited to circular and/or hole shapes, and they may also be formed in an oval shape, a rectangular shape, a longish shape having both semi-circular ends, or any other similar and/or suitable shape and the shapes thereof may be changed variously as long as they restrict transmission of internal vibration generated by a shock to the display module 110, and more specifically, a shock to the sealing member 113. In the embodiment of FIG. 7, the plurality of openings 130 are formed in the space S of about 5-20 mm, and more specifically, about 10 mm, to have a size R of about 1.5-3.5 mm, and preferably, about 2.5 mm. However, the present disclosure is not limited thereto, and the plurality of openings 130 may have any suitable size, and the size R and a size of the interval D may also be any suitable size.

The interval D is between the openings 130, that is, the interval D is between one of the opening 130 and its adjacent opening 130 and the interval D is less than the size R of the opening 130 to restrict transmission of vibration in the support plate 120 to the display module 110, such that the interval D is about 1.5-3.5 mm, preferably, 2.5 mm. Such a structure is based on the size of a recently provided portable electronic device as an example, and therefore, it is desirable to form the openings 130, taking into account of the size of the display module 110 and/or the size of the electronic device 100 in which the openings 130 are provided. The openings 130 are formed in at least two lines inwardly from the peripheral circumference of the support plate 120 to effectively restrict vibration generated in the support plate 120, caused by the external shock.

FIGS. 8, 9, 10, and 11 are diagrams illustrating other examples of the support plate of FIG. 4 according to an embodiment of the present disclosure.

Referring to FIGS. 8, 9, 10, and 11, the following description will be made of various embodiments of the openings 130. FIGS. 8 through 11 are diagrams illustrating different embodiments of the support plate 120, and more specifically, different embodiments of openings 130, in FIG. 4. In the description of the embodiments, differences of the openings 130 of one embodiment that is different than those of another embodiment will be described in detail, and the same structures or components as those of the electronic device 100 of different embodiments will not be repetitively described and will refer to the foregoing description of an embodiment. First, similarities between the embodiments will be described first.

As shown in FIGS. 8 through 11, openings 130a, 130b, 130c, and 130d, according to the embodiments, are configured such that the openings 130a, 130b, 130c, and 130d are in two lines and have a predetermined rule, respectively. That is, the openings 130a, 130b, 130c, and 130d are formed, respectively, in at least two lines inwardly from the peripheral circumference of the support plate 120 to effectively restrict vibration generated in the support plate 120 due to an external shock applied to the electronic device 100, and in the embodiments of FIGS. 8 through 11, the openings 130a, 130b, 130c, and 130d are regularly formed, respectively, in two lines, for example. The plurality of openings 130a, 130b, 130c, and 130d respectively include first openings 131a, 131b, 131c, and 131d and second openings 132a, 132b, 132c, and 132d.

In the embodiments shown in FIGS. 8 through 11, the first openings 131a, 131b, 131c, and 131d and the second openings 132a, 132b, 132c, and 132d are formed in parallel with each other, being spaced apart from each other by the predetermined interval D, and are provided along the peripheral circumference of the support plate 120 to face the sealing member 113. In the embodiments shown in FIGS. 8 through 11, the size R or interval D in the openings 130a, 13b, 130c, and 130d, and the space S provided in the openings 130a, 130b, 130c, and 130d, have already been described in detail in the description of the openings according to the embodiment described above, and thus will be described in brief at this time.

Also in the embodiments of FIGS. 8 through 11, the size and/or width R of the openings 130a, 130b, 130c, and 130d is about 1.5-3.5 mm, and may be about 2.5 mm, and the interval D in the openings 130a, 130b, 130c, and 130d is equal to the size R of the openings 130a, 130b, 130c, and 130d, such that a size of the interval D is about 1.5-3.5 mm, and more specifically, about 2.5 mm. In the predetermined space S, along the peripheral circumference of the support plate 120, wherein the predetermined space S has a size of about 5-25 mm, and may be about 10 mm, the first openings 131a, 131b, 131c, and 131d and the second openings 132a, 132b, 132c, and 132d are formed in parallel with each other and to be adjacent to each other. However, for example, the first openings 131a, 131b, 131c, and 131d and the second openings 132a, 132b, 132c, and 132d may also be positioned inwardly and/or outwardly with respect to the sealing member 113, and the plurality of openings 130 may be randomly dispersed, so as to be not specifically dispersed, and in this way, the positions or shapes of the openings 130 may be changed variously as long as vibration inside the electronic device 100 is reduced by the openings 130 of the support plate 120 to restrict transmission of vibration to the sealing member 113.

Figure 3:
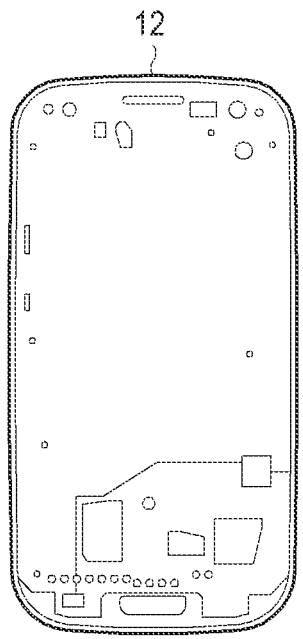
FIG. 3 is a diagram showing the number of times a shock caused by dropping of the electronic device is applied when the display module is damaged according to the related art.
Figure 8:
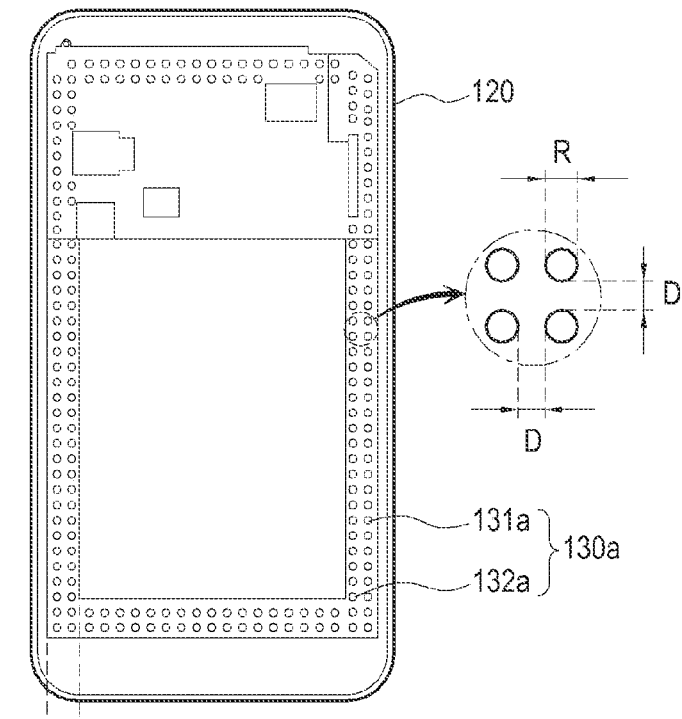
FIGS. 8, 9, 10, and 11 are diagrams illustrating other examples of the support plate of FIG. 4 according to an embodiment of the present disclosure.

In the embodiments of FIGS. 8 through 11, a feature of the openings 130a, according to the embodiment illustrated in FIG. 8, is that the first openings 131a and the second openings 132a, which are formed in two lines with the predetermined interval D there between, are in circular hole shapes, thus restricting transmission of vibration generated in the support plate 120 to the display module 110 and thus reducing the vibration. Therefore, as will be described below, when the openings 130a, according to the embodiment of FIG. 8, are provided in the support plate 120, if the electronic device 100 is dropped 8.60 times on average, more specifically, if the electronic device 100 is dropped to the front and thus a shock is applied to the electronic device 100, the display module 110 is damaged (see FIG. 13A). When compared to FIG. 3, in which the display module 110 of the electronic device 10, including the support plate 11 where the openings 130 are not provided, is damaged by an average of 5.40 times of dropping, the openings 130a are regularly provided in the embodiment of FIG. 8, thus significantly reducing damage of the display module 110.

Figure 9:
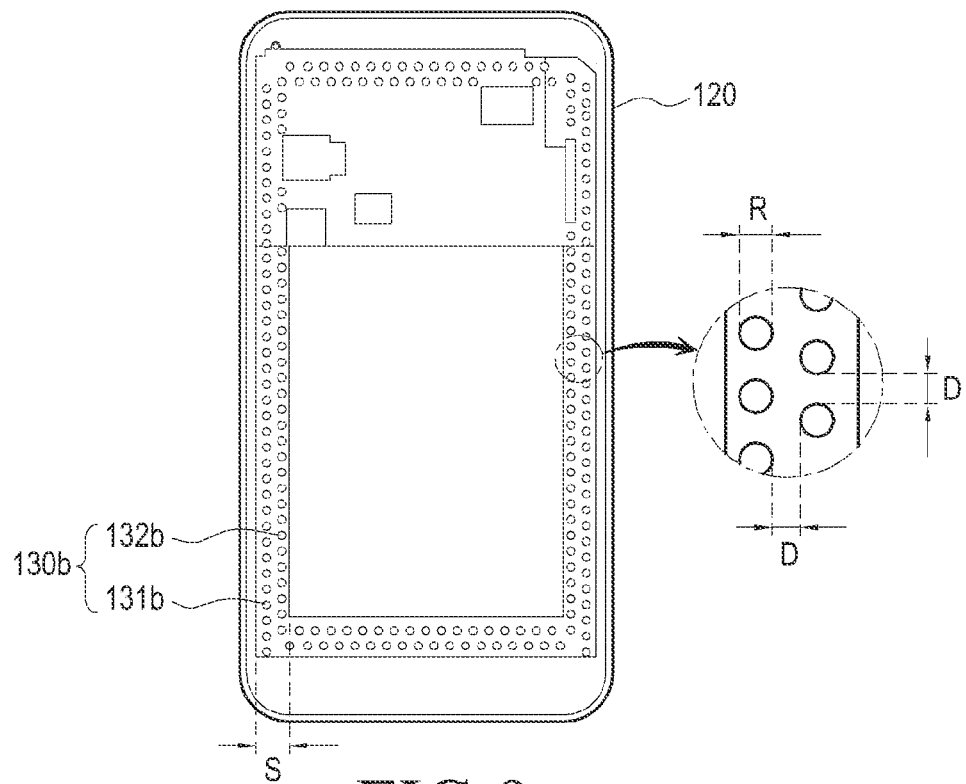

The openings 130b according to an embodiment illustrated in FIG. 9 have the same shapes and structures as the embodiment of FIG. 8, except that the first openings 131a and the second openings 132b have different positions. That is, the first openings 131b and the second openings 132b, according to the embodiment of FIG. 9, are formed in circular shapes in parallel, being spaced apart by the predetermined interval D, like in the embodiment of FIG. 8, such that each second opening 132b, according to the embodiment of FIG. 9, is positioned between the first opening 131b and its adjacent first opening 131b. More specifically, the second openings 132b are positioned diagonally with respect to the first openings 131a, thus restricting transmission of vibration generated in the support plate 120 to the display module 110.

Figure 10:
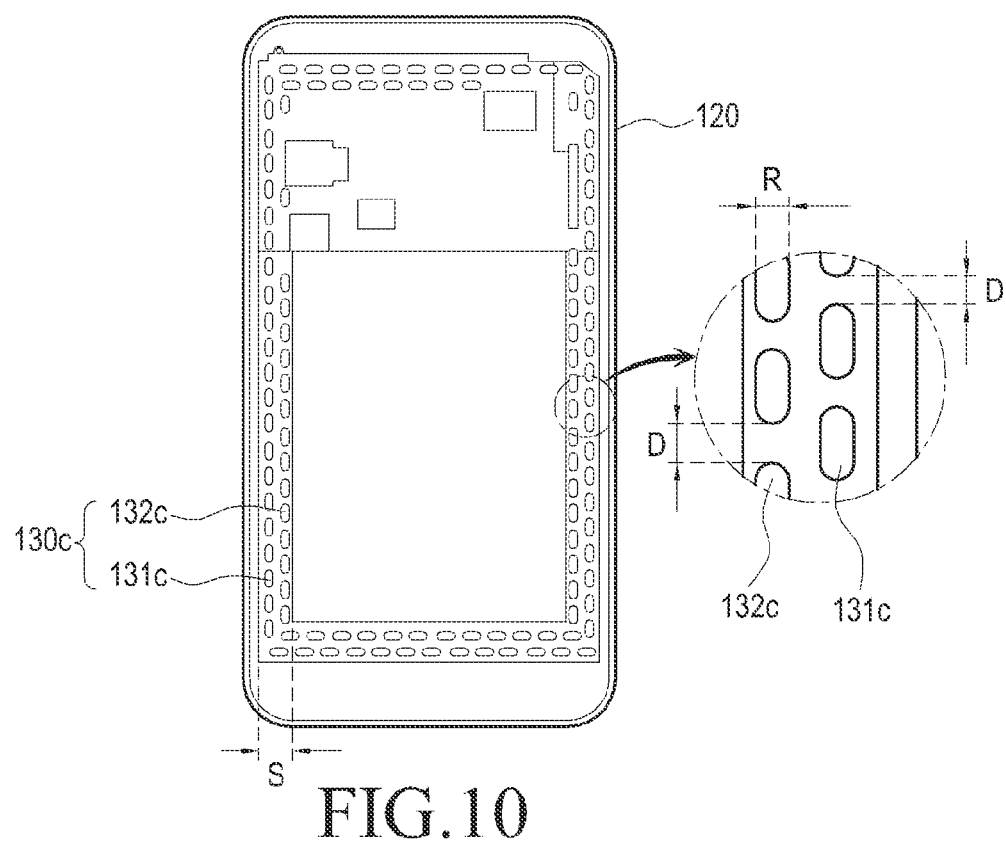

The openings 130c, according to an embodiment illustrated in FIG. 10, are different in shape from the openings 130a, according to the embodiment of FIG. 8. That is, the openings 130, 130a, and 130b, according to the embodiments FIGS. 7 through 9, are described as having circular hole shapes, but the openings 130c, according to the embodiment of FIG. 10, have rectangular shapes in which both end portions are semi-circular and/or elliptically shaped, and thus are in longish shapes in a longitudinal direction of the peripheral circumference of the support plate 120. That is, the first openings 131c and the second openings 132c, according to the embodiment of FIG. 10, are formed in parallel along the peripheral circumference of the support plate 120, being spaced by the predetermined interval D, and the first openings 131c and the second openings 132c are provided on the same plane.

Although not shown, the first openings 131c and the second openings 132c, having the same shapes as in the embodiment of FIG. 10, may also be formed to cross each other. If vibration is generated in the support plate 120 having the openings 130c, according to the embodiment of FIG. 10, formed therein due to a shock generated in the outer side of the electronic device 100, transmission of the vibration to the display module 110 is restricted by the openings 130c, thereby implementing high reliability in terms of damage of the display module 110.

Figure 11:
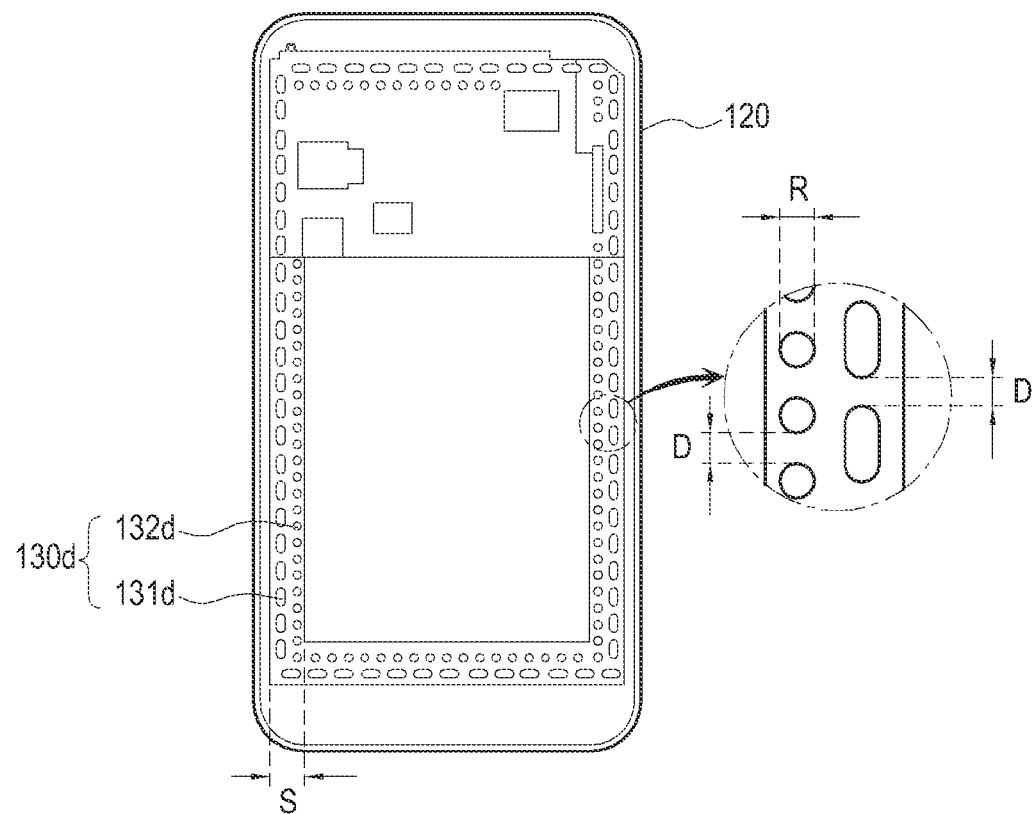

The openings 130d, according to a an embodiment illustrated in FIG. 11, are different from those according to the embodiments of FIGS. 8 through 10, in that the shapes of the first openings 131d are different from those of the second openings 132d. That is, the first openings 131d are formed in longish shapes, whose both end portions are in semi-circular shapes, and the second openings 132d are formed in circular hole shapes. Although not shown, on the contrary, the first openings 131d may be formed in circular hole shapes and the second openings 132d may be formed in longish shapes. The first openings 131d and the second openings 132d having different shapes are formed in parallel with each other. The size R of the first openings 131d is equal to that of the second openings 132d, and the interval D between the first openings 131d, the interval D between the second openings 132d, and the interval D between the first openings 131d and the second openings 132d are less than the diameter R of the semi-circular shapes. Thus, like the openings 130a, 130b, and 130c according to the embodiments of FIGS. 8 through 10, transmission of vibration generated in the support plate 120 to the display module 110 is restricted and/or reduced, thereby preventing damage of the display module 110.

However, the size R of the first openings 131d may be different from that of the second openings 132d, and the interval D between the first openings 131d and the second openings 132d may vary, and in this way, various modifications may be possible. As will be described, when the openings 130d, according to the embodiment of FIG. 11, are provided in the support plate 120, if the electronic device 100 is dropped 9.50 times on average, and more specifically, if a shock is applied to the front surface of the electronic device 100, then the display module 110 may be damaged (see FIG. 12C). When compared to FIG. 3 where the display module of the related-art electronic device 10, having the support plate 11 in which the openings 130 are not provided, may be damaged by an average of 5.40 times of dropping, in the embodiment of FIG. 11, the openings 130a are regularly provided, thus further reducing damage of the display module 110 as compared to the related-art electronic device 10 and the electronic device 100 having the openings 130a according to the embodiment of FIG. 8.

Figure 12:
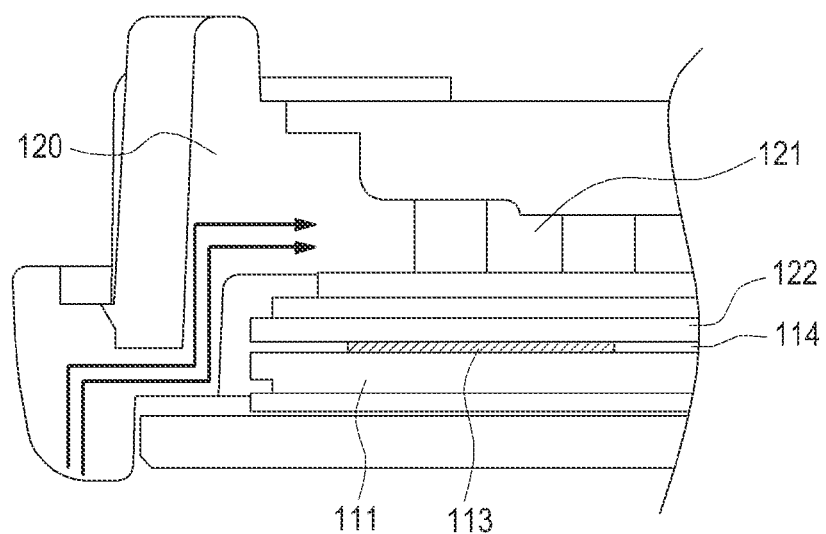
FIG. 12 is a diagram showing vibration caused by a shock applied to a front surface of the electronic device of FIG. 4 according to an embodiment of the present disclosure.
Figures 13A, 13B:
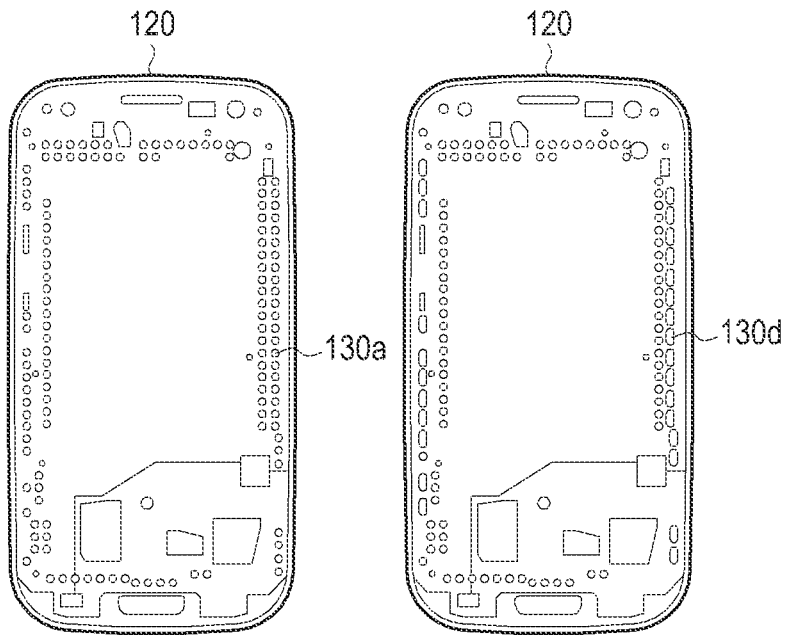
FIGS. 13A and 13B are diagrams showing the number of times a shock is applied when the display module is damaged with respect to the number of openings provided on the support plate according to an embodiment of the present disclosure.

FIG. 12 is a diagram showing vibration caused by a shock applied to the front face of the electronic device according to an embodiment of the present disclosure, and FIGS. 13A and 13B are diagrams showing the number of times a shock is applied when the display module is damaged with respect to the number of openings provided in the support plate according to an embodiment of the present disclosure.

Referring to FIGS. 12, 13A, and 13B, the number of times a shock which causes damage of the display module 110 is applied is shown with respect to the shapes of the openings 130 provided in the support plate 120. That is, in the electronic device 100 having the support plate 120 provided with the openings 130a, according to the embodiment of FIG. 8, that is, the openings 130a formed regularly in two lines on the same plane, the display module 110 may be damaged when a shock is applied 8.60 times to the front surface of the OCTA display module 110. In comparison to the number of times a shock is applied to the electronic device 100, when the display module 110 is damaged as in a related-art case and an average of 5.40 times the shock is applied, then the number of times a shock is applied, which causes damage of the display module 110, is increased.

In FIG. 13B, that is, in the electronic device 100, having the support plate 120 provided with the openings 130d according to the embodiment of FIG. 11, and more specifically, having the first openings 131d and the second openings 132d which are formed regularly in different shapes, the display module 110 may be damaged when the shock is applied 9.50 times on the average to the front surface of the display module 110. In this way, the number of times a shock is applied to the electronic device 100, which causes damage of the display module 110, increases merely with formation of the openings 130, and also according to the shapes of the openings 130.

FIGS. 14A, 14B, 15A, and 15B are diagrams showing the intensity and magnitude of principal stress transmitted to the display module due to an external shock applied to the electronic device, according to an embodiment of the present disclosure.

Figure 14A:
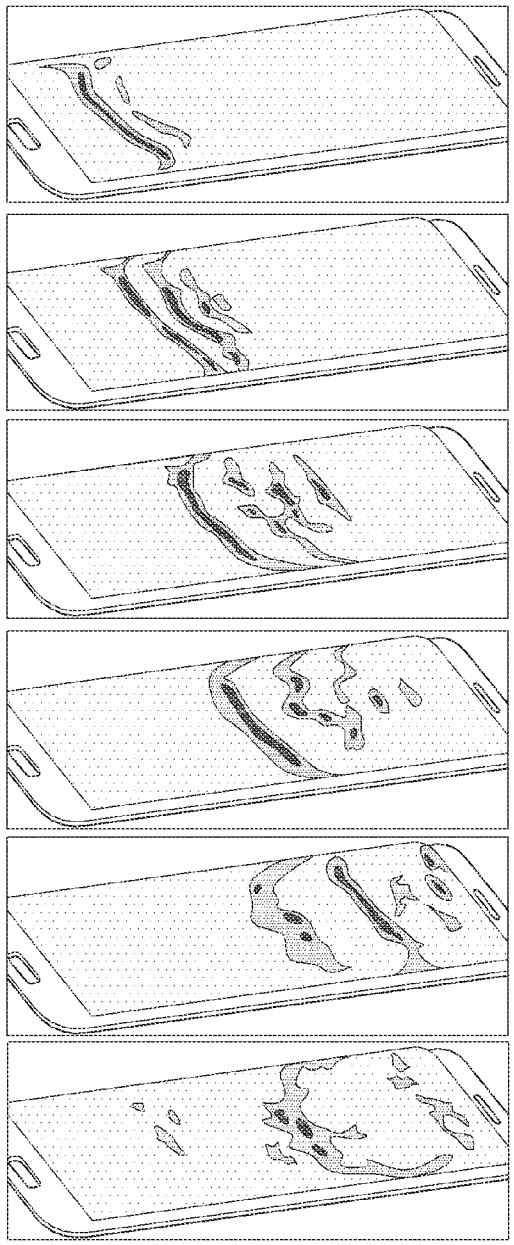
FIGS. 14A, 14B, 15A, and 15B are diagrams showing the intensity and magnitude of principal stress transmitted to the display module due to an external shock applied to the electronic device according to an embodiment of the present disclosure.
Figure 14B:
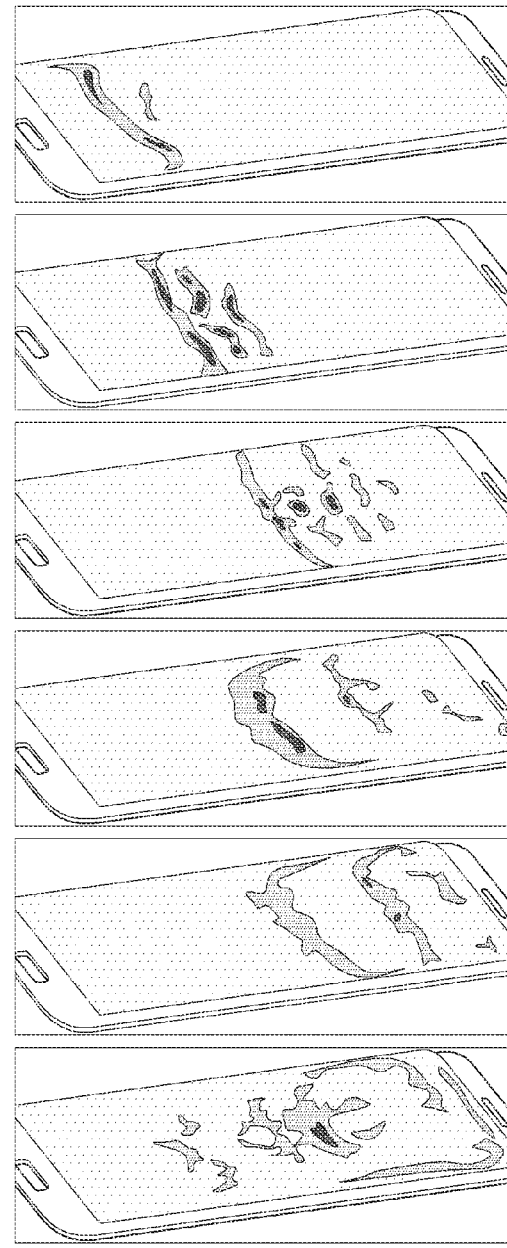
Figure 15A:
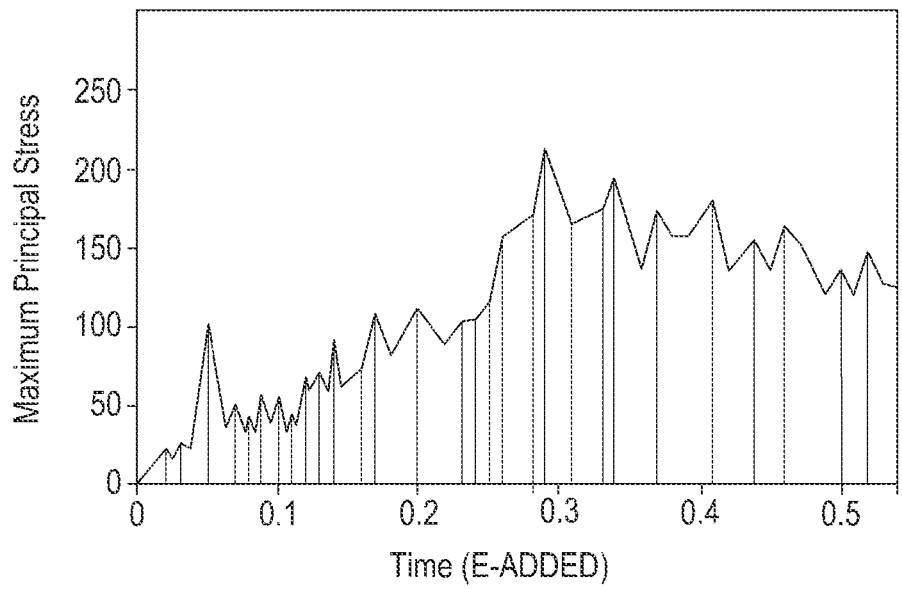
Figure 15B:
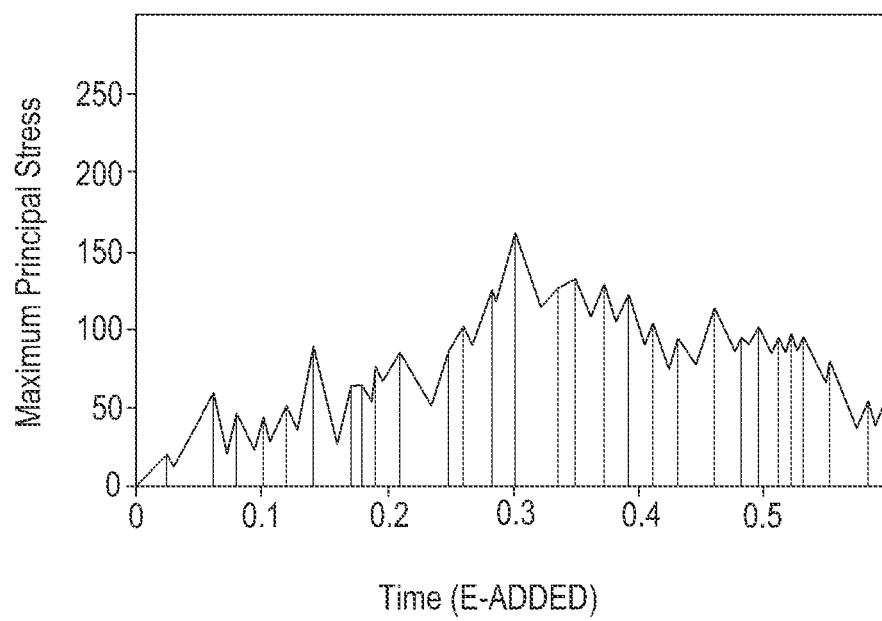

Referring to FIGS. 14A and 15A, stress corresponding to vibration when openings are not provided are shown, and FIGS. 14B and 15B show the intensity of stress corresponding to vibration transmitted to the display module 110 when openings are provided, in which the intensity of principal stress corresponding to vibration transmitted to the display module 110 is degraded, i.e. reduced, when the openings are formed. It can also be seen that when compared to FIG. 14A, a red-color portion, corresponding to a high stress portion, is smaller in FIG. 14B, which means that the amplitude of vibration transmitted to the display module 110 is reduced. It can also be seen from FIG. 15B that stress transmitted to the display module 110 is reduced to 150 lb from 215 lb as shown in FIG. 15A.

In an embodiment, the openings 130 are provided in the display module 110, and more specifically, are provided in the support plate 120 in which the display module 110 is placed, thus restricting transmission of internal vibration, which is caused by a shock generated in the outer side of the electronic device 100 on which the display module 110 is mounted, to the display module 110. Hence, damage of the display module 110, and more specifically, damage of the display module 110 caused by damage of the sealing member 113, may be prevented, such that the reliability of the display module 110 may be improved when the external shock is generated.

Moreover, a total weight of the support plate 120, in which the openings 130 are formed, is reduced, thus reducing the total weight of the electronic device 100. Hence, the portability of the electronic device 100 is increased, and with the reduction of the weight of the electronic device 100, the amount of the shock applied to the electronic device 100 may be reduced when the shock is applied to the electronic device 100 from the same height and with the same force.

In the electronic device structured as described above, transmission of vibration, generated in the support plate by a shock generated in the outer side of the electronic device, to the display module is reduced and/or restricted by the openings, thereby reducing damage of the display module.

Therefore, user's reliability of the electronic device in terms of damage of the display module caused by dropping of the electronic device may be improved.

Moreover, since the plurality of openings are provided in the support plate, the weight of the support plate is reduced. Hence, with the lower total weight of the electronic device, even if a shock, such as dropping, is generated, the amount of shock applied to the electronic device may be reduced and the portability of the electronic device may be improved.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
    a display module having a first surface and a second surface;
    a support plate having a top surface and a rear surface, the second surface of display module being disposed on the top surface of the support plate; and
    a battery disposed on the rear surface of the support plate,
    wherein the support plate includes a plurality of openings disposed along an outer circumference of the support plate, and
    wherein the plurality of openings is adjacent to the second surface of the display module to reduce vibration transmitted to the display module through the support plate.

2. The electronic device of claim 1, wherein the display module comprises:
    an upper plate;
    a lower plate; and
    a sealing member which forms a cell sealing portion between the upper plate and the lower plate in order to seal the upper plate with the lower plate.

3. The electronic device of claim 2, wherein the plurality of openings are disposed in an outer peripheral circumference of the support plate along a peripheral portion of the sealing member.

4. The electronic device of claim 3, wherein the plurality of openings are disposed along at least one of an inner peripheral portion of the sealing member and an outer peripheral portion of the sealing member.

5. The electronic device of claim 2, wherein the upper plate comprises ENCAPsulation (ENCAP) glass, and
    wherein the lower plate comprises Low Temperature Poly Silicon (LTPS) glass.

6. The electronic device of claim 2, further comprising:
    a window member disposed on a top surface of the upper plate on an outer side of the display module; and
    a transparent coupling member disposed between the upper plate and the window member.

7. The electronic device of claim 2, wherein the display module is an On Cell Touch (OCT) type Active Matrix Organic Light Emitting Diode (AMOLED) (OCTA).

8. The electronic device of claim 1, wherein the plurality of openings are formed in at least two lines along a peripheral circumference of the support plate.

9. The electronic device of claim 8, wherein the at least two lines are approximately parallel to each other along a first direction, and
    wherein the plurality of openings in one of the at least two lines are not parallel to the plurality of openings in another one of the at least two lines in a second direction that is approximately orthogonal to the first direction.

10. The electronic device of claim 8, wherein the plurality of openings comprise:
    a plurality of first openings disposed so as to be adjacent to each other along a peripheral circumference of the support plate; and
    a plurality of second openings disposed so as to be adjacent to each other inwardly from the plurality of first openings along the peripheral circumference of the support plate.

11. The electronic device of claim 10, wherein the plurality of second openings are disposed so as to be adjacent to the plurality of first openings.

12. The electronic device of claim 10, wherein each second opening is disposed between the first opening and an adjacent first opening.

13. The electronic device of claim 1, wherein an interval between the opening and an adjacent opening is less than a size of the opening.

14. The electronic device of claim 1, wherein the plurality of openings are disposed in a space of 5-25 mm along a peripheral circumference of the support plate.

15. The electronic device of claim 1,
    wherein the size of each of the plurality of openings is 1.5-3.5 mm, and
    wherein an interval between one of the plurality of openings and an adjacent opening is 1.5-3.5 mm.

16. The electronic device of claim 1, wherein the plurality of openings have circular hole shapes.

17. The electronic device of claim 1, wherein the plurality of openings have rectangular shapes in a longitudinal direction of the support plate, and
    wherein both ends of the rectangular shapes have semi-circular shapes.

18. The electronic device of claim 1, wherein some of the plurality of openings have a different shape than others of the plurality of openings.

19. An electronic device comprising:
    a main body;
    a display module including an upper plate, a lower plate coupled to the upper plate, and a cell sealing portion between the upper plate and the lower plate;
    a support plate; and
    a battery,
    wherein the display module is disposed between the main body and the support plate,
    wherein the support plate is disposed between the battery and the display module, and
    wherein a plurality of openings is formed along a peripheral circumference of the support plate adjacent to the lower plate of the display module to reduce internal vibration of the display module.

20. The electronic device of claim 19, wherein the display module is an On Cell Touch (OCT) type Active Matrix Organic Light Emitting Diode (AMOLED) (OCTA).

21. The electronic device of claim 20,
    wherein the cell sealing portion further comprises a sealing member disposed between the upper plate and the lower plate, and
    wherein the plurality of openings are arranged to correspond to a peripheral portion of the sealing member.

22. The electronic device of claim 21, wherein the plurality of openings are formed in at least two lines along a peripheral circumference of the support plate.

23. The electronic device of claim 22, wherein the at least two lines are approximately parallel to each other along a first direction, and
    wherein the plurality of openings in one of the at least two lines are not parallel to the plurality of openings in another one of the at least two lines in a second direction that is approximately orthogonal to the first direction.

24. The electronic device of claim 21, wherein an interval between one of the plurality of openings and an adjacent opening is less than a size of the one of the plurality of openings.

25. The electronic device of claim 19, wherein some of the plurality of openings have a different shape than others of the plurality of openings.

* * * * *